United States Patent
Pelley et al.

(10) Patent No.: US 9,111,634 B2
(45) Date of Patent: Aug. 18, 2015

(54) METHODS AND STRUCTURES FOR MULTIPORT MEMORY DEVICES

(75) Inventors: Perry H. Pelley, Austin, TX (US);
James D. Burnett, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 257 days.

(21) Appl. No.: 13/548,843

(22) Filed: Jul. 13, 2012

(65) Prior Publication Data

US 2014/0015061 A1 Jan. 16, 2014

(51) Int. Cl.
| | |
|---|---|
| H01L 23/522 | (2006.01) |
| G11C 11/412 | (2006.01) |
| G11C 7/18 | (2006.01) |
| G11C 7/02 | (2006.01) |
| G11C 5/06 | (2006.01) |
| G11C 8/16 | (2006.01) |
| H01L 21/8228 | (2006.01) |

(52) U.S. Cl.
CPC .............. *G11C 11/412* (2013.01); *G11C 5/063* (2013.01); *G11C 7/02* (2013.01); *G11C 7/18* (2013.01); *G11C 8/16* (2013.01); *H01L 21/8228* (2013.01)

(58) Field of Classification Search
USPC .................................................. 257/401, 208
IPC .................................................. H01L 21/8228
See application file for complete search history.

(56) References Cited

U.S. PATENT DOCUMENTS

| | | | |
|---|---|---|---|
| 6,411,543 B2* | 6/2002 | Narui et al. ................... | 365/149 |
| 6,980,462 B1 | 12/2005 | Ramesh et al. | |
| 7,002,258 B2 | 2/2006 | Mali et al. | |
| 7,057,963 B2 | 6/2006 | Yang | |
| 7,161,845 B2* | 1/2007 | Hsieh et al. ............... | 365/189.05 |
| 7,254,068 B2* | 8/2007 | Ueno et al. ..................... | 365/198 |
| 7,365,432 B2 | 4/2008 | Liaw | |
| 7,404,154 B1 | 7/2008 | Venkatraman et al. | |
| 7,459,743 B2 | 12/2008 | Mandelman et al. | |
| 7,511,982 B2* | 3/2009 | Kurjanowicz et al. .......... | 365/96 |
| 7,535,751 B2* | 5/2009 | Huang et al. .................. | 365/154 |
| 7,542,334 B2* | 6/2009 | Bertin et al. .................. | 365/156 |
| 7,577,040 B2 | 8/2009 | Liaw | |
| 7,613,050 B2* | 11/2009 | Braceras et al. ......... | 365/189.07 |
| 7,671,422 B2* | 3/2010 | Wang ............................ | 257/369 |
| 7,738,282 B2 | 6/2010 | Liaw | |
| 8,044,437 B1* | 10/2011 | Venkatraman et al. ....... | 257/206 |
| 8,582,352 B2* | 11/2013 | Liaw ............................ | 365/154 |
| 8,587,982 B2* | 11/2013 | Kim et al. ........................ | 365/63 |
| 2005/0253287 A1* | 11/2005 | Liaw ............................ | 257/903 |
| 2009/0073758 A1* | 3/2009 | Freeman et al. .............. | 365/174 |

OTHER PUBLICATIONS

U.S. Appl. No. 13/548,848, Burnett, J.D., et al., "SRAM Bit Cell with Reduced Bit Line Precharge Voltage", filed Jul. 13, 2012.

* cited by examiner

*Primary Examiner* — Eugene Lee

(57) ABSTRACT

A memory device includes a storage unit formed using a substrate, a true bit line BL0 for carrying a bit of data, and a complementary bit line for carrying the bit of data carried by the first true bit line in complementary form. The true bit line is coupled to the storage unit and runs laterally over the substrate. The true bit line and the complementary bit line are adjacent to each other and are vertically stacked above the substrate.

13 Claims, 6 Drawing Sheets

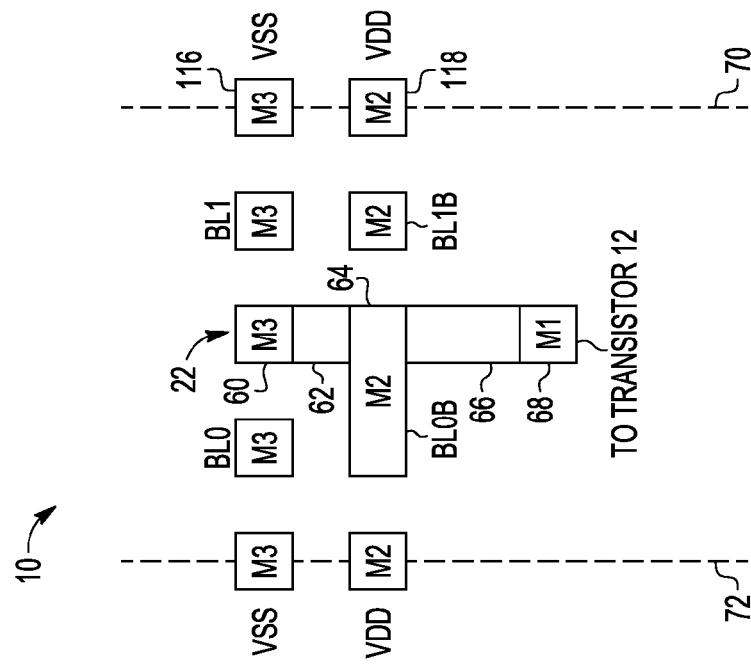
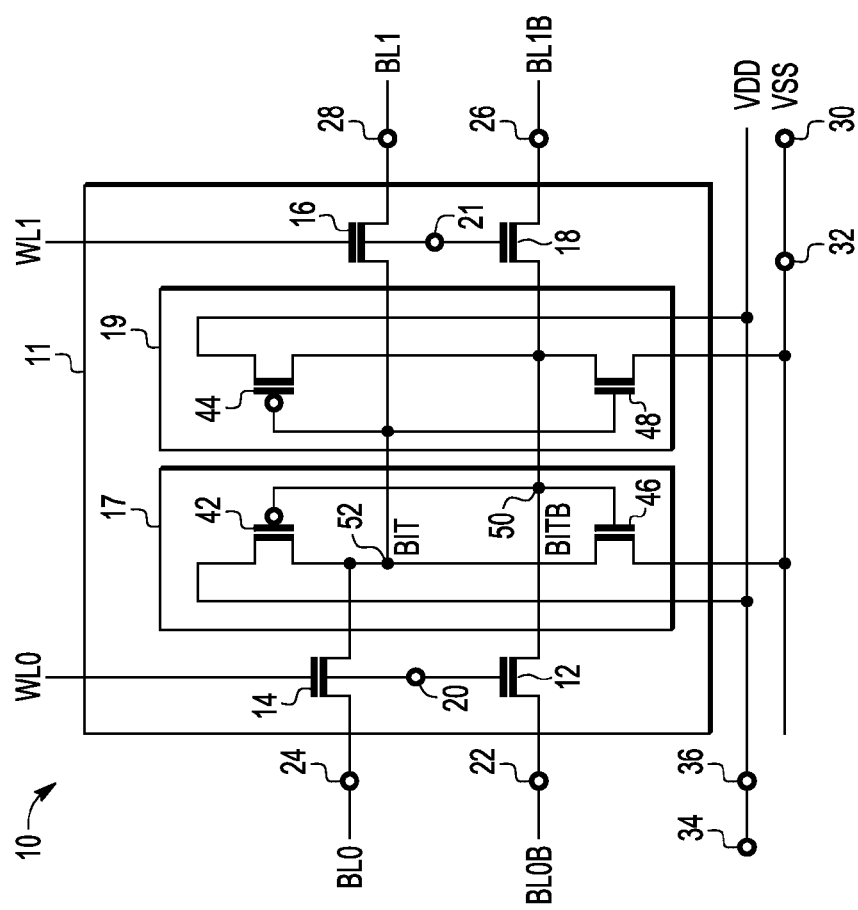
FIG. 2
FIG. 1

METHODS AND STRUCTURES FOR MULTIPORT MEMORY DEVICES

BACKGROUND

1. Field

This disclosure relates generally to semiconductor devices, and more specifically, to multiport semiconductor memory devices.

2. Related Art

Along with recent advancements of semiconductor technologies, smaller-size and larger-capacity memories that allow high-speed reading/writing operations have been developed. Further, a so-called multiport memory including plural input ports and output ports has been used for reading/writing data of different addresses.

Coupling capacitance between bit lines in memory devices can be sufficiently large to interfere with memory operations. Where the coupling capacitance is sufficiently large, data sense operations must be delayed until enough bit line difference occurs for a read operation. Without any compensation for coupling capacitance, performance of the memory device can be degraded. For most memory devices, each bit line has a coupling effect on an adjacent bit line voltage swing. The coupling effect will cause the memory device to malfunction, or will reduce the performance of the device. Twisted bit line techniques have been applied to single port memories. Even when the bit lines are twisted as in single port memory, read and write data still have coupling capacitance issues because the twisting is imperfect compensation. In multiport memories with concurrent Read and Write bit lines coupling to adjacent Read bit lines is most significant. The coupling interactions are more complex than in single port memories. Therefore, a need exists to compensate for bit line coupling capacitance in multiport memory devices.

BRIEF DESCRIPTION OF THE DRAWINGS

The present disclosure is illustrated by way of example and is not limited by the accompanying figures, in which like reference numbers indicate similar elements. Elements in the figures are illustrated for simplicity and clarity and have not necessarily been drawn to scale.

FIG. 1 shows a schematic diagram of an embodiment of a semiconductor memory cell in accordance with the present invention.

FIG. 2 shows a first cross-sectional side view of the semiconductor memory cell of FIG. 1.

DETAILED DESCRIPTION

Figure 4:
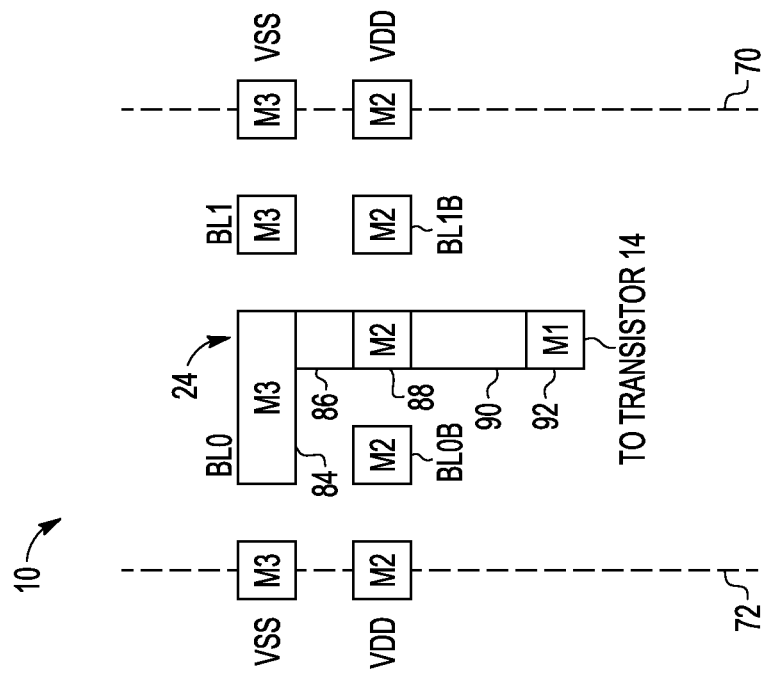
FIG. 4 shows a third cross-sectional side view of the semiconductor memory cell of FIG. 1.

Embodiments of methods and semiconductor memory devices disclosed herein provide fully isolated bit line pairs for asynchronous Read/Write multiport operation, that is, concurrent Read and Write operations. True bit lines (BL) and complementary bit lines (BLB) are vertically stacked. M2 and M3 power lines (VDD and VSS) are stacked between bit line pairs and connected orthogonal to M4 and M1 to form VDD and VSS power grids. Two M4 word lines are included per port. One of the word lines is local to the memory cell and another word line is global to an array of memory cells. VDD and ground lines are shared between the ports of adjacent memory cells. The metal lines connecting the true bit lines and complementary bit lines are the same length with equivalent interconnect and thus have the same parasitic capacitance. The intervening power lines and matched interconnect prevent harmful coupling between the bit line pairs and thus enhances performance of the memory cells.

FIG. 1 shows a schematic diagram of an embodiment of a semiconductor memory cell 10 in accordance with the present invention that comprises storage unit 11 with NMOS pass transistors 12, 14, 16, 18, a first inverter 17 including PMOS transistor 42 and NMOS transistor 46, and a second inverter 19 including PMOS transistor 44 and NMOS transistor 48. Bit line 0 (BL0) is coupled to a first current carrying electrode of transistor 14, bit line 0 bar (BL0B) is coupled a first current carrying electrode of transistor 12, bit line 1 BL1 is coupled to a first current carrying electrode of transistor 16, and bit line 1 bar (BL1B) is coupled to a first current carrying electrode of transistor 18. Word line 0 (WL0) is coupled to the gate electrodes of transistors 14 and 12, and word line 1 (WL1) is coupled to the gate electrodes of transistors 16 and 18. BL0 and BL1 are referred herein to as true bit lines because they carry a value of "1" when they are set true. BL0B and BL1B are referred to herein as complementary bit lines because they carry a value that is the opposite of the value carried by respective BL0 and BL1.

When activated by word line WL0 pass transistor 14 couples the BL0 signal to the input of inverter 19. When activated by WL0 pass transistor 12 couples the BL0B signal to the input of inverter 17. When activated by WL1 pass transistor 16 couples the BL1 signal to the input of inverter 19. When activated by WL1 pass transistor 18 couples the BL1B signal to the input of inverter 17.

BITB node 50 couples the gate electrodes of transistors 42 and 46 to the second current carrying electrodes of transistors 12 and 18. BIT node 52 couples the gate electrode of transistors 44 and 48 to the second current carrying contacts of transistors 14 and 16.

Inverters 17, 19 are cross-coupled, with the gate electrodes of transistors 42 and 46 being coupled to the drain electrodes of transistors 44 and 48, and the gate electrodes of transistors 44 and 48 being coupled to the drain electrodes of transistor 42 and 46.

The source electrodes of transistors 46 and 48 are coupled to VSS and the source electrodes of transistors 42 and 44 are coupled to VDD.

Vias 20, 21, 22, 24, 26, 28, 30, 32, 34, and 36 indicate how the circuitry of memory cell 10 relates to the physical layout of overlying metals of the physical layout to be discussed with regard to FIGS. 2-10. Via stack 24 couples the BL0 signal to overlying metals, and via stack 22 couples the BL0B signal to overlying metals. Via stack 20 couples the WL0 signal to overlying metals.

Via stack 28 is couples the signal BL1 to overlying metals and via stack 26 couples the BL1B signal to overlying metals. Via stack 21 couples the WL1 Signal to overlying metals.

Via stacks 34 and 36 couple VDD to overlying metal and via stacks 30 and 32 couple VSS to overlying metal. The connection of the via stacks will be further explained during the description of the remaining figures.

FIG. 2 shows a first cross-sectional side view of the semiconductor memory cell 10 of FIG. 1 including via stack 22. Via stack 22 comprises M3 pad 60 coupled by M2-M3 via 62 to bit line BL0B which is coupled by M1-M2 via 66 to M1 pad 68 which is coupled to transistor 12 by a contact not shown. A pad is a minimum length metal line for coupling between two vias. The M3 bit lines BL1 and BL0, the M3 VSS lines 116, M2 bitline BL1B, and the M2 VDD lines 118 are not coupled in this cross section. M3 metal pad 60 and M2-M3 via 62 are for capacitive coupling matching and provide no circuit conductivity. Dashed lines 70 and 72 represent the cell boundaries of bit cell 10. One half of each of the VDD and VSS lines is shared with an adjacent memory cell to memory cell 10.

Figure 3:
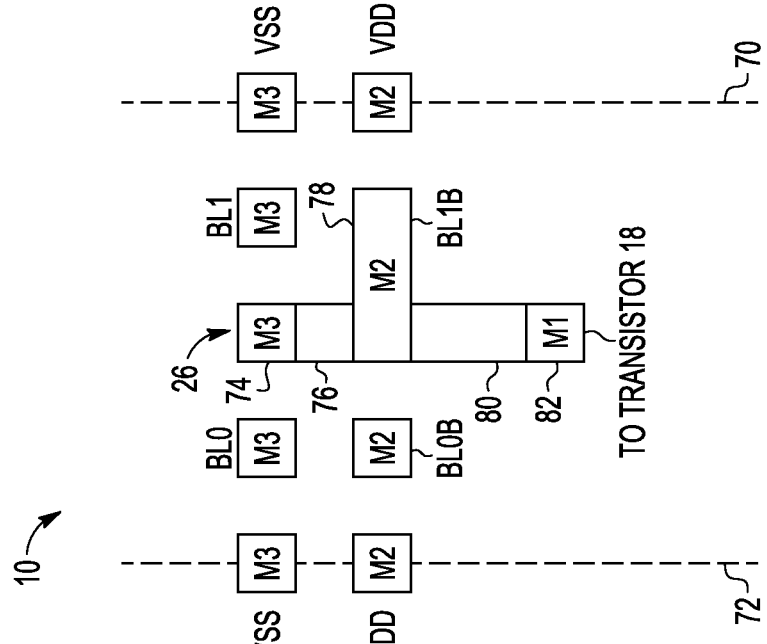
FIG. 3 shows a second cross-sectional side view of the semiconductor memory cell of FIG. 1.

FIG. 3 shows a second cross-sectional side view of the semiconductor memory cell 10 of FIG. 1 including via stack 26. Via stack 26 comprises M3 pad 74, which is coupled by M2-M3 via 76 to M2 bit line BL1B, which is coupled by M1-M2 via 80 to the M1 metal pad 82, which is coupled to transistor 18 by a contact (not shown). The M3 BL1 and BL0 bit lines, M3 VSS lines, the M2 BL0B bit line and the M2 VDD lines are not coupled in the cross section view in FIG. 3. M3 metal pad 74 and M2-M3 via 76 are for capacitive coupling matching and provide no circuit conductivity. Dashed lines 70 and 72 represent the cell boundaries of bit cell 10. One half of each of the VDD and VSS lines is shared with an adjacent memory cell to memory cell 10.

FIG. 4 shows a third cross-sectional side view of the semiconductor memory cell 10 of FIG. 1 including via stack 24. Via stack 24 comprises M3 BL0 84 coupled by M2-M3 via 86 to M2 pad 88 which is coupled by M2-M1 via 90 to M1 pad 92 which is coupled to transistor 14 by a contact (not shown). The M3 BL1 bit line, the M3 VSS lines, the M2 BL1B and BL0B bit lines and the M2 VDD lines are not coupled in the cross section view in FIG. 4. Dashed lines 70 and 72 represent the cell boundaries of bit cell 10. One half of each of the VDD and VSS lines is shared with an adjacent memory cell to memory cell 10.

Figure 5:
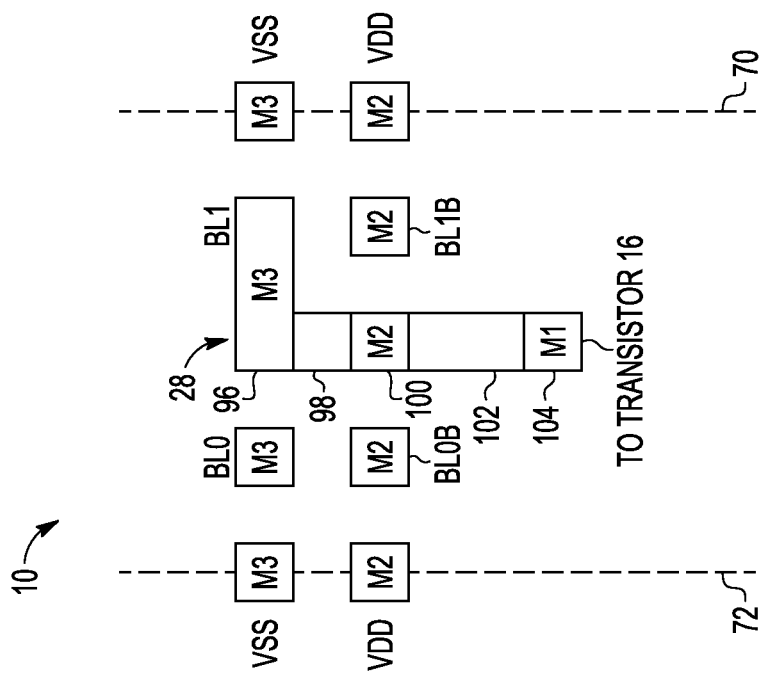
FIG. 5 shows a fourth cross-sectional side view of the semiconductor memory cell of FIG. 1.

FIG. 5 shows a fourth cross-sectional side view of the semiconductor memory cell 10 of FIG. 1 including via stack 28. Via stack 28 comprises M3 bit line BL1 96 coupled by a M2-M3 via 98 to an M2 pad 100, which is coupled by M1-M2 via 102 to M1 pad 104, which is coupled to transistor 16 by a contact not shown. The M3 BL0 bit line, the M3 VSS lines, the M2 BL0B and BL1B bit lines and the M2 VDD lines are not coupled in the cross section view in FIG. 5. Dashed lines 70 and 72 represent the cell boundaries of bit cell 10. One half of each of the VDD and VSS lines is shared with an adjacent memory cell to memory cell 10.

Figure 6:
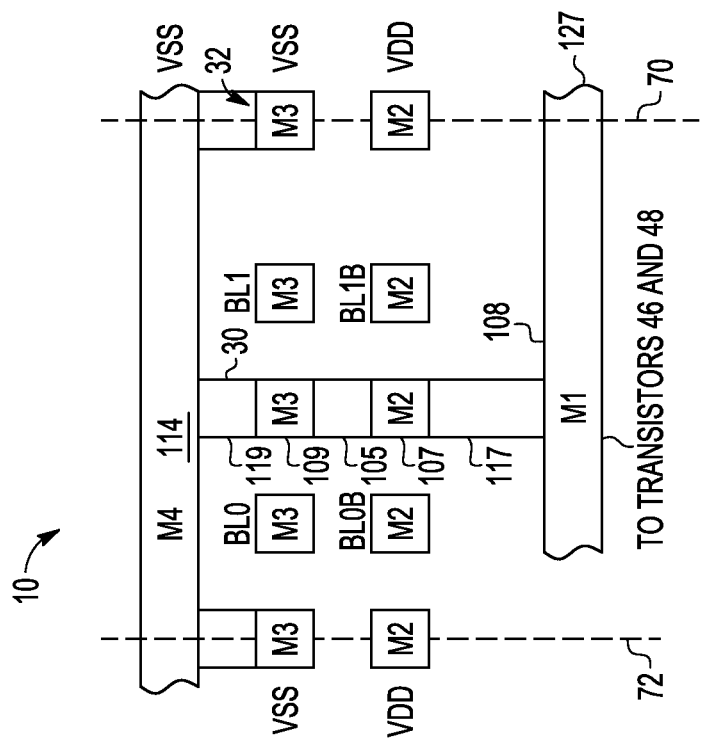
FIG. 6 shows a fifth cross-sectional side view of the semiconductor memory cell of FIG. 1.

FIG. 6 shows a fifth cross-sectional side view of the semiconductor memory cell 10 of FIG. 1 with via stack 30. Via stack 30 comprises M4 VSS line 114, which is coupled by M3-M4 via 119 to the M3 VSS line 109, which is coupled by M2-M3 via 105 to the M2 VSS line 107, which is coupled by M1-M2 via 117 to the M1 line 127, which is coupled to transistors 46 and 48 by contacts not shown. Via stack 32 comprises a M3-M4 via connecting M4 VSS to M3 VSS. M3 bit lines BL0 and BL1, M2 bit lines BL0B and BL1B, and M2 VDD lines are not coupled in the cross section view in FIG. 6. Dashed lines 70 and 72 represent the cell boundaries of bit cell 10. One half of each of the VDD and VSS lines is shared with an adjacent memory cell to memory cell 10.

Figure 7:
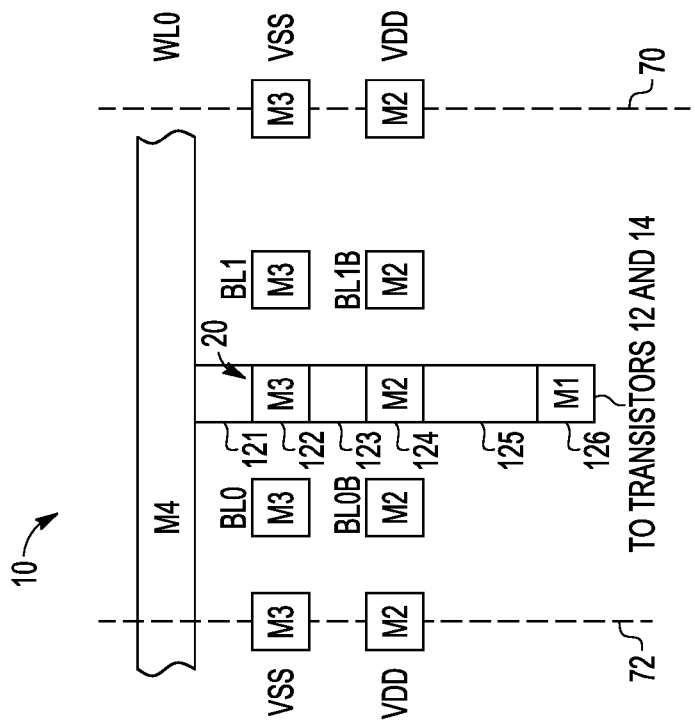
FIG. 7 shows a sixth cross-sectional side view of the semiconductor memory cell of FIG. 1.

FIG. 7 shows a sixth cross-sectional side view of the semiconductor memory cell 10 of FIG. 1 with via stack 34. Via stack 34 comprises M4 VDD line 120, which couples by M3-M4 via 115 to M3 line 112, which couples by M3-M2 via 113 to M2 line 110, which couples by M1-M2 via 114 to M1 Metal line 111, which couples to transistors 42 and 44 by contacts not shown. M1 line 111 is coupled by via 36 to M2 line 118. M3 bit line BL0, M3 bit line BL1, M3 VSS line 116, M2 bit line BL0B, and M2 bit line BL1B, are not coupled in the cross section view in FIG. 7. Dashed lines 70 and 72 represent the cell boundaries of bit cell 10. One half of each of the VDD and VSS lines is shared with an adjacent memory cell to memory cell 10.

Figure 8:
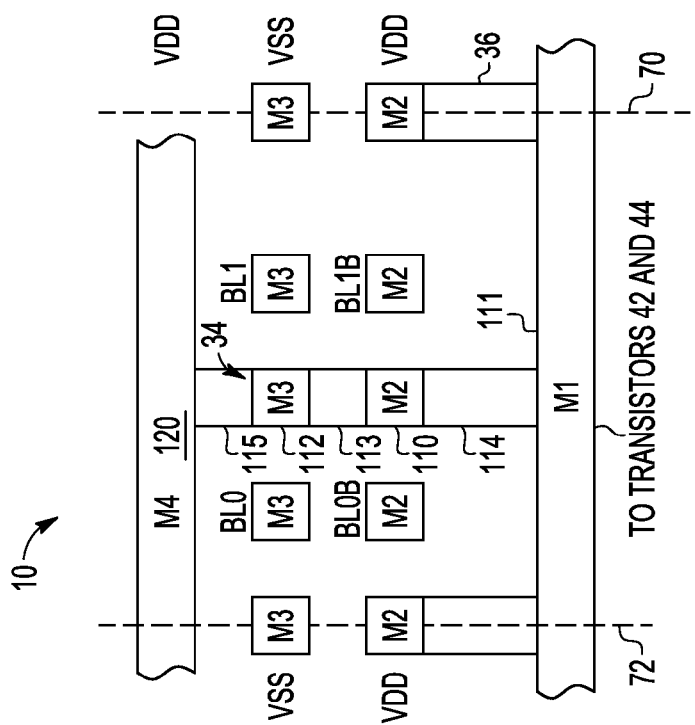
FIG. 8 shows a seventh cross-sectional side view of the semiconductor memory cell of FIG. 1.

FIG. 8 shows a seventh cross-sectional side view of the semiconductor memory cell 10 of FIG. 1 with via stack 20. Via stack 20 couples M4 word line WL0 to transistors 12 and 14 by way of M3 pad 122, M2 pad 124, M1 metal pad 126, M4-M3 via 121, M3-M2 via 123 and M2-M1 via 125. M3 bit line BL0, M3 bit line BL1, M3 VSS line 116, M2 bit line BL0B, M2 bit line BL1B, and M2 VDD line 118 are not coupled in the cross section view in FIG. 8. Dashed lines 70 and 72 represent the cell boundaries of bit cell 10. One half of each of the VDD and VSS lines is shared with an adjacent memory cell to memory cell 10.

A cross section through via stack 21 has a similar cross section as that shown in FIG. 8. Via stack 21 connects WL1 to transistors 16 and 18 in a similar way via stack 20 connects WL0 to transistors 12 and 14.

Figure 9:
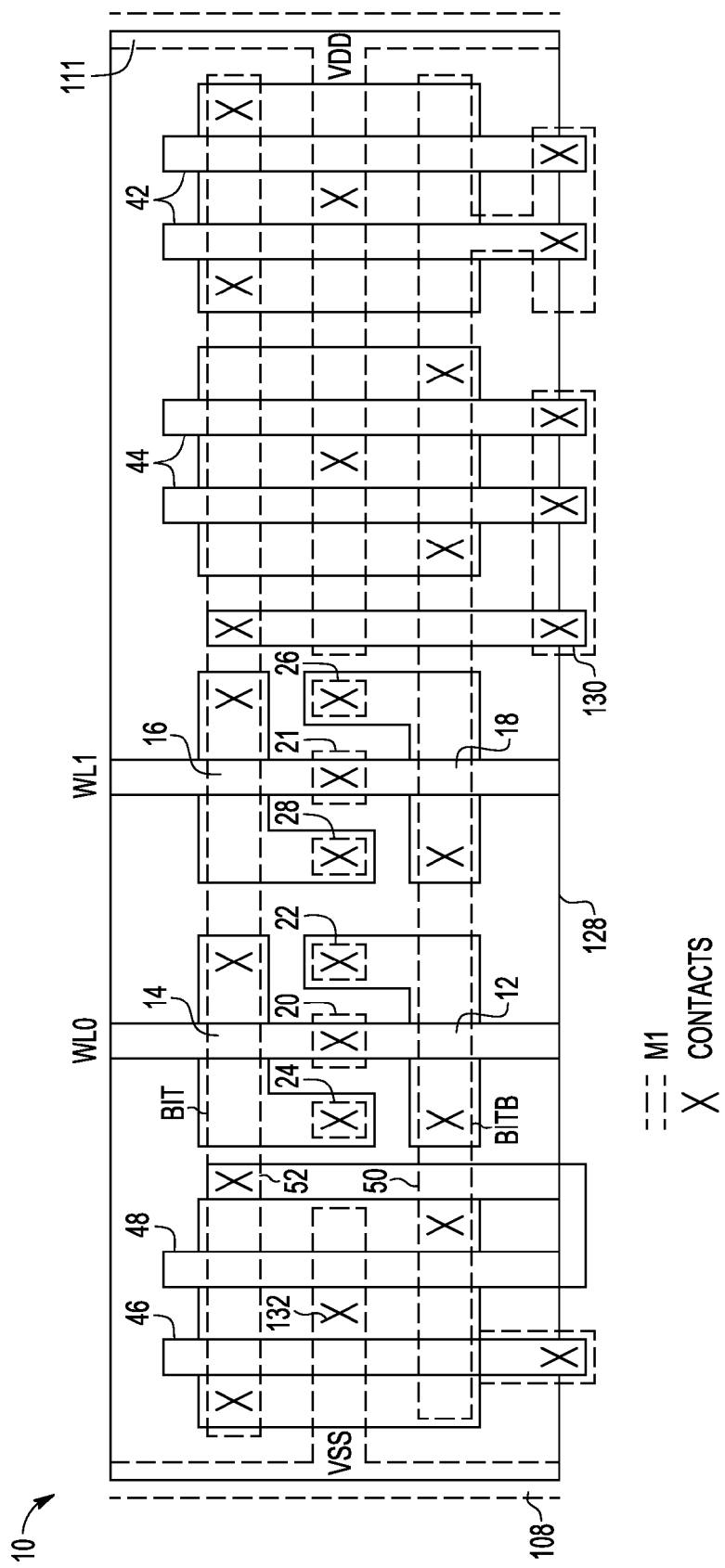
FIG. 9 shows a top view of the physical layout of the first metal layer and contacts of the semiconductor memory cell of FIG. 1.

FIG. 9 shows a top view of a first metal (M1) layer of the semiconductor memory cell 10 of FIG. 1 in dashed lines to more easily distinguish the metal lines in the M1 layer from other components of memory cell 10. The narrow primarily vertical shapes 12, 14, 16, 18, 42, 44, 46, 48 are the poly layer and the wider shapes are the active layer defining the transistors of the same number. Contacts are shown as an 'X'. M1 VSS line 108 straddles the length of the left edge of memory cell 10 so that a second memory cell not shown could share M1 line 108 with memory cell 10. M1 line 108 includes a central portion that extends to a contact 132 that provides a connection to VSS to transistors 46 and 48.

BIT node M1 line 52 couples contacts to transistors 14, 16, 42, 44, 46, 48.

BITB node M1 line 50 couples contacts to transistors 12, 18, 44, 46 and 48, and has an extention to connect to transistor 42.

The M1 pad of via stack 24 is coupled to the active layer of transistor 14 by a contact. The M1 pad of via stack 20 is coupled to the WL0 poly gates of transistor 12 and 14 by a contact. The M1 pad of via stack 22 is coupled to the active layer of transistor 12 by a contact. The M1 pad of via stack 28 is coupled to the active layer of transistor 16 by a contact. The M1 pad of via stack 21 is coupled to the WL1 poly gate of transistors 16 and 18 by a contact. The M1 pad of via stack 26 is coupled to the active layer of transistor 18 by a contact.

M1 line 130 is coupled to a contact to jumper 130 to contacts to the gate electrodes of transistor 44.

The M1 VDD line 111 straddles the length of the right edge of memory cell 10 so that a third memory cell not shown could share M1 line 111 with memory cell 10. M1 line 111 includes a central portion that extends to couple a contact to transistor 42 and a contact to transistor 44. The bottom and top of memory cell 10 can be shared with a fourth and fifth memory cell above and below memory cell 10 such that the contacts and interconnect at the bottom of memory cell 10 overlap, but do not connect to the circuit elements or interconnect of the adjacent memory cell that would appear below memory cell 10. The rectangle 128 indicates a portion of the substrate underlying memory cell 10.

Figure 10:
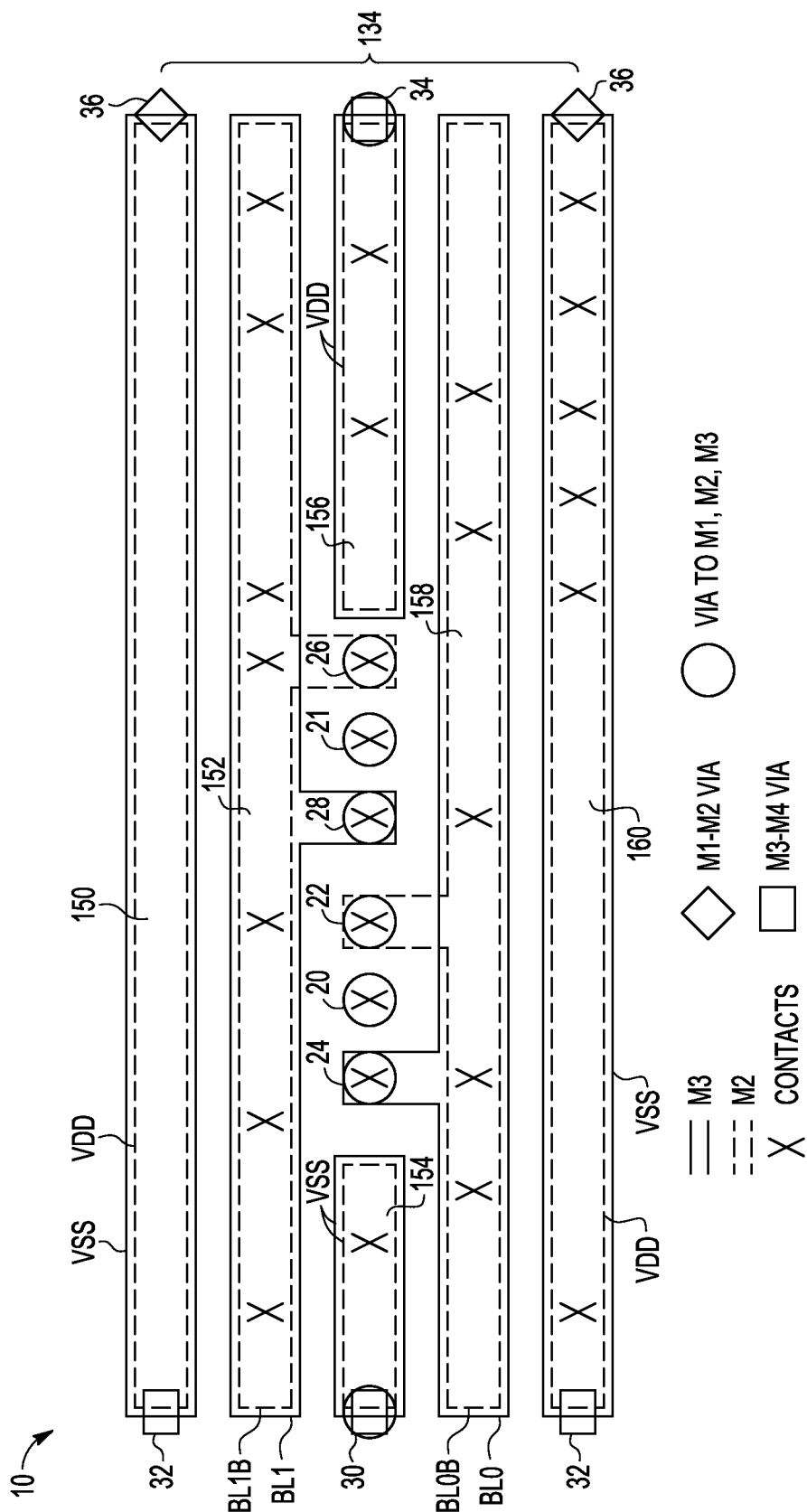
FIG. 10 shows a top view of the physical layout of second and third metal layers, vias, and contacts of the semiconductor memory cell of FIG. 1.

FIG. 10 shows a top view of second metal M2 lines and third metal M3 lines along with via stacks and contacts of the semiconductor memory cell 10 of FIG. 1. The contacts do not couple to M2 and are shown for orientation purposes only. The curly bracket 134 shows the extent of memory cell 10 in the vertical direction. Via stacks 20-34 shown with circles around them indicate that via stacks 20-34 extend from M1 to M4 layers. Via stacks 32 are shown as squares to indicate that they extend from M2 to M1 layers. Via stacks 36 are indicated with a diamond symbol to indicate that they extend from M3 to M4 layers. M2lines are shown in dashed lines while M3 lines are shown in solid lines. M4 word lines not shown comprise local word lines that couple to memory cell 10 and global word lines which pass over memory cell 10. The M4 word lines and power lines not shown are substantially perpendicular to the bit lines.

At the top edge of memory cell 10, lines 150 include M2 and M3 lines that extend for the length of memory cell 10 between via stack 32 and via stack 36. The M2 line 150 is coupled to VDD and M3 line 150 is coupled to VSS. M2 and M3 lines extend beyond the top edge of the boundary 134 of memory cell 10 on substrate 128 to share VDD and VSS with an adjacent memory cell (not shown). Vias 32 and 36 also share with adjacent memory cells.

Adjacent to line 150, line 152 comprises M2 and M3 lines that conduct BL1B and BL1, respectively, through the M1 of FIG. 8 to contacts for transistors 18 and 16 respectively and to other memory cells. The M2 line includes an extension to a couple to via stack 26 and the M3 line includes an extension to couple to via stack 28.

Adjacent to line 152, line segments 154 and 156 comprising M2 and M3 lines are positioned at either end of memory cell 10 to supply VSS and VDD isolation between bit lines and provide no conductivity. Via stacks 20-28 are positioned between line segments 154 and 156 such that any coupling to an adjacent unconnected bit line pairs is common mode, that is, any coupling to an adjacent unconnected bit line pair is equal and therefore has no net effect on the signal on the adjacent unconnected bit line pair. Line segments 154 comprise M2 and M3 lines which are coupled to VSS through via stack 30. Line segment 156 includes M2 and M3 lines which are coupled to VDD through via stack 34.

Adjacent to line segments 154 and 156, line 158 comprises M2 and M3 lines that conduct BL0B and BL0, respectively, to M1 and contacts for transistors 12 and 18 respectively and to other memory cells. The M2 line includes an extension to a contact in via stack 22 and the M3 line includes an extension to a contact in via stack 24.

At the bottom edge of memory cell 10, line 160 includes M2 and M3 line that extend the length of memory cell 10 between via stack 32 and via stack 36. M2 line is coupled to VDD and M3 line is coupled to VSS. M2 and M3 lines extend beyond the bottom edge of the boundary 134 of memory cell 10 on substrate 128 to share VDD and VSS with an adjacent memory cells not shown. Via stacks 32 and 36 also share with adjacent memory cells.

By now it should be appreciated that, in some embodiments a memory device 10 can comprise a storage unit 11 formed using a substrate 128, and a first true bit line BL0 for carrying a bit of data. The first true bit line can be coupled to the storage unit and runs laterally over the substrate. A first complementary bit line BL0B can carry the bit of data carried by the first true bit line in complementary form. The first true bit line and the first complementary bit line are adjacent to each other and vertically stacked above the substrate.

In another aspect, a first via stack 24 and a second via stack 22 can be in a line parallel to the first true bit line and the first complementary bit line. The first via stack can couple the first true bit line to the storage unit and the second via stack can couple the first complementary bit line to the storage unit.

In another aspect, the storage unit can comprise a first pass transistor 14 and a second pass transistor 12. The first via stack can be coupled to the first pass transistor and the second via stack can be coupled to the second pass transistor.

In another aspect, a second true bit line BL1 for carrying a bit of data can be coupled to the storage unit and can run parallel to the first true bit line and first complementary bit line. A second complementary bit line BL1B can carry the bit of data carried by the second true bit line in complementary form. The second true bit line and the second complementary bit line can be adjacent to each other and vertically stacked above the substrate.

In another aspect, a third via stack 28 and a fourth via stack 26 can be in line with the first and second via stacks. The third via stack can couple the second true bit line to the storage unit and the fourth via stack can couple the second complementary bit line to the storage unit.

In another aspect, the line of the first, second, third, and fourth via stacks can be between the first true bit line and the second true bit line.

In another aspect, the first, second, third, and fourth via stacks can each have a first portion 88,64,100,78 formed from a first metal layer M2 and a second portion 84,60,96,74 formed from a second metal layer M3 formed at a time difference from the first metal layer in which an insulating layer is formed during the time difference. The first and second bit lines can be from the second metal layer M3 and the first and second complementary bit lines can be from the first metal layer M2. The first portion of the first via stack can be connected to the first true bit line by a first connecting portion of the second metal layer. The first portion of the third via stack can be connected to the second true bit line by a second connecting portion of the second metal layer. The first portion of the second via stack can be connected to the first complementary bit line by a first connecting portion of the first metal layer. The first portion of the fourth via stack can be connected to the second true bit line by a second connecting portion of the first metal layer.

In another aspect, the storage unit can further comprise a third pass transistor 16 and a fourth pass transistor 18. The third via stack can be coupled to the third pass transistor and the fourth via stack can be coupled to the fourth pass transistor.

In another aspect, a first word line WL0 and a second word line WL1 can run orthogonal to and above the first and second true bit lines and the first and second complementary bit lines. The first word line can be coupled to gates of the first and second pass transistors and the second word line can be coupled to gates of the third and fourth pass transistors.

In another aspect, a word line WL0 can run orthogonal to and over the first true bit line and the first complementary bit line and can be coupled to the storage unit.

In other embodiments, methods of making a memory device can comprise forming a storage unit 11 using a substrate 128; and forming a first metal layer M2 over the substrate to form a first bit line BL0B. A first portion 66 of a first via stack 22 can couple the first bit line to the storage unit, and a first portion 90 of a second via stack 24 can be coupled to the storage unit. A second metal layer M3 can be formed that is insulated from the first metal layer to form a second bit line BL0 directly over the first bit line. A second portion 62 of the first via stack can be formed. A second portion 86 of the second via stack can be formed to couple the second bit line to the storage unit. The first and second bit lines can be complementary to each other.

In another aspect, forming the storage unit can comprise forming a first pass transistor 12 and a second pass transistor 14; and forming the first metal layer can be further characterized by the coupling the first bit line to the storage unit comprising coupling the first bit line to the first pass transistor and by the first portion of the second via stack being coupled to the second pass transistor.

In another aspect, forming the first metal layer M2 can form a third bit line BL1B, a first portion 80 of a third via stack 26 coupling the third bit line to the storage unit, and a first portion 102 of a fourth via stack 28 being coupled to the storage unit. Forming the second metal layer M3 can form a fourth bit line BL1 directly over the third bit line, a second portion 76 of the third via stack, and a second portion 98 of the fourth via stack to couple the fourth bit line to the storage unit. The third and fourth bit lines are complementary to each other.

In another aspect, the forming the storage unit can comprise forming a third pass transistor 18 and a fourth pass transistor 16. Forming the first metal layer can be further characterized by the coupling the third bit line to the storage unit comprising coupling the third bit line to the third pass transistor and by the first portion of the fourth via stack being coupled to the fourth pass transistor.

In another aspect, the forming the first metal layer can be further characterized by a line of the first portion of the first via stack, the first portion of the second via stack, the first portion of the third via stack, and the first portion of the fourth via stack being parallel to and between the first bit line and the third bit line.

In another aspect, the step of forming a storage unit can comprise forming a static random access memory cell as the storage unit. A third metal layer M4 can be formed comprising a first word line WL0 coupled to gates of the first and second pass transistors and a second word line WL1 coupled to gates of the third and fourth pass transistors. The first and second word lines run orthogonal to the first, second, third, and fourth bit lines.

In another aspect, forming the first metal layer can form a third bit line BL1B, a first portion 80 of a third via stack 26 coupling the third bit line to the storage unit, and a first portion 102 of a fourth via stack 28 being coupled to the storage unit. Forming a second metal layer can form a fourth bit line BL1 directly over the third bit line, a second portion 76 of the third via stack, and a second portion 98 of the fourth via stack to couple the fourth bit line to the storage unit. The third and fourth bit lines can be complementary to each other and the second portions of the first, second, third, and fourth bit lines can be in a line parallel to and between the second and fourth bit lines. A third metal layer M4 can be formed comprising a first word line WL0 coupled to a first control input of the storage unit and a second word line WL1 coupled to a second control input of the storage unit. The first and second word lines can run orthogonal to the first, second, third, and fourth bit lines.

In further embodiments, a memory device can comprise a static random access memory cell 11 including transistors 22, 24, 42, 46, 44, 48 in a substrate 128 and having a first input/output, a second input/output, and a first control input. The first control input can enable the first and second input/outputs and the first input/output can be complementary to the second input/output. A first bit line BL0B can be coupled to the first input/output. A second bit line BL0 can be coupled to the second input/output. The first bit line and the second bit line can be stacked vertically above a plane of the substrate in which a first insulating layer is over the first bit line and the second bit line is over the insulating layer.

In another aspect, the static random access memory cell can have a third input/output, a fourth input/output, and a second control input. The second control input can enable the third and fourth input/outputs and the third input/output can be complementary to the fourth input/output. A third bit line BL1B can be coupled to the third input/output. A fourth bit line BL1 can be coupled to the fourth input/output. The third bit line and the fourth bit line can be stacked vertically above the plane of the substrate in which a second insulating layer is over the third bit line and the fourth bit line is over the insulating layer.

In another aspect, the first and second bit lines can run in a first line, the third and fourth bit lines can run in a second line parallel to the first line, and the first line can be laterally spaced from the second line. A first via stack 22, a second via stack 24, a third via stack 26 and a fourth via stack 28 can run in a third line parallel to and between the first and second lines. The first via stack can be coupled to the first input/output and the first bit line. The second via stack can be coupled to the second input/output and the second bit line. The third via stack can be coupled to the third input/output and the third bit line. The fourth via stack can be coupled to the fourth input/output and the fourth bit line.

Memory cell 10 can be one of many such memory cells included in an array of cells in a memory device. The memory device may be implemented in a standalone semiconductor die, or as part of a system on a chip that includes memory and processing components. Memory cell 10 can be a static random access memory cell or other suitable type of memory cell.

The term "coupled," as used herein, is not intended to be limited to a direct coupling or a mechanical coupling.

The semiconductor substrate 128 described herein can be any semiconductor material or combinations of materials, such as gallium arsenide, silicon germanium, silicon-on-insulator (SOI), silicon, monocrystalline silicon, the like, and combinations of the above.

Additionally, insulating layers (not shown) are formed between M1, M2, M3 and M4 layers when memory cell 10 is fabricated.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. For example the invention might be applied to single port memory cells or memory cells with more than two ports. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory device, comprising:
   a storage unit formed using a substrate;
   a first true bit line for carrying a bit of data, wherein the first true bit line is coupled to the storage unit and runs laterally over the substrate; and
   a first complementary bit line for carrying the bit of data carried by the first true bit line in complementary form,
   wherein the first true bit line and the first complementary bit line are adjacent to each other and vertically stacked one on top of the other above the substrate.

2. The memory device of claim 1, further comprising a first via stack and a second via stack that are in a line parallel to the first true bit line and the first complementary bit line, wherein the first via stack couples the first true bit line to the storage unit and the second via stack couples the first complementary bit line to the storage unit.

3. The memory device of claim 2, wherein the storage unit comprises a first pass transistor and a second pass transistor, wherein the first via stack is coupled to the first pass transistor and the second via stack is coupled to the second pass transistor.

4. The memory device of claim 1, further comprising:
   a second true bit line for carrying a bit of data, wherein the second true bit line is coupled to the storage unit and runs parallel to the first true bit line and first complementary bit line; and
   a second complementary bit line for carrying the bit of data carried by the second true bit line in complementary form;
   wherein the second true bit line and the second complementary bit line are adjacent to each other and vertically stacked above the substrate.

5. The memory device of claim 4, further comprising:
   a third via stack and a fourth via stack that are in line with the first and second via stacks, wherein the third via stack couples the second true bit line to the storage unit and the fourth via stack couples the second complementary bit line to the storage unit.

6. The memory device of claim 5, wherein the line of the first, second, third, and fourth via stacks is between the first true bit line and the second true bit line.

7. The memory device of claim 6, wherein:
   the first, second, third, and fourth via stacks each have a first portion formed from a first metal layer and a second portion formed from a second metal layer formed at a time difference from the first metal layer in which an insulating layer is formed during the time difference;
   the first and second bit lines are from the second metal layer and the first and second complementary bit lines are from the first metal layer;
   the first portion of the first via stack is connected to the first true bit line by a first connecting portion of the second metal layer;
   the first portion of the third via stack is connected to the second true bit line by a second connecting portion of the second metal layer;
   the first portion of the second via stack is connected to the first complementary bit line by a first connecting portion of the first metal layer; and
   the first portion of the fourth via stack is connected to the second true bit line by a second connecting portion of the first metal layer.

8. The memory device of claim 6, wherein the storage unit further comprises a third pass transistor and a fourth pass transistor, wherein the third via stack is coupled to the third pass transistor and the fourth via stack is coupled to the fourth pass transistor.

9. The memory device of claim 8, further comprising a first word line and a second word line running orthogonal to and above the first and second true bit lines and the first and second complementary bit lines, wherein the first word line is coupled to gates of the first and second pass transistors and the second word line is coupled to gates of the third and fourth pass transistors.

10. The memory device of claim 1, further comprising a word line running orthogonal to and over the first true bit line and the first complementary bit line and coupled to the storage unit.

11. A memory device, comprising:
    a static random access memory cell including transistors in a substrate and having a first input/output, a second input/output, and a first control input, wherein the first control input enables the first and second input/outputs and the first input/output is complementary to the second input/output;
    a first bit line coupled to the first input/output; and
    a second bit line coupled to the second input/output,
    wherein:
    the first bit line and the second bit line are stacked vertically one on top of the other above a plane of the substrate in which a first insulating layer is over the first bit line and the second bit line is over the insulating layer.

12. The memory device of claim 11 wherein the static random access memory cell has a third input/output, a fourth input/output, and a second control input, wherein the second control input enables the third and fourth input/outputs and the third input/output is complementary to the fourth input/output, further comprising:
    a third bit line coupled to the third input/output; and
    a fourth bit line coupled to the fourth input/output,
    wherein the third bit line and the fourth bit line are stacked vertically above the plane of the substrate in which a second insulating layer is over the third bit line and the fourth bit line is over the insulating layer.

13. The memory device of claim 12, wherein the first and second bit lines run in a first line, the third and fourth bit lines run in a second line parallel to the first line, and the first line is laterally spaced from the second line, further comprising
    a first via stack, a second via stack, a third via stack and a fourth via stack that run in a third line parallel to and between the first and second lines,
    wherein:
    the first via stack is coupled to the first input/output and the first bit line;
    the second via stack is coupled to the second input/output and the second bit line;

the third via stack is coupled to the third input/output and the third bit line; and the fourth via stack is coupled to the fourth input/output and the fourth bit line.

* * * * *